United States Patent [19]
Yonehara et al.

[11] Patent Number: 5,733,369
[45] Date of Patent: Mar. 31, 1998

[54] METHOD FOR FORMING CRYSTAL

[75] Inventors: Takao Yonehara, Atsugi; Yasuhiro Naruse, Hiratsuka, both of Japan

[73] Assignee: Canon Kabushiki Kaisha, Tokyo, Japan

[21] Appl. No.: 479,854

[22] Filed: Jun. 7, 1995

Related U.S. Application Data

[63] Continuation of Ser. No. 164,788, Dec. 10, 1993, abandoned, which is a continuation of Ser. No. 824,875, Jan. 24, 1992, abandoned, which is a continuation of Ser. No. 409,284, Sep. 19, 1989, abandoned, which is a continuation of Ser. No. 154,458, Feb. 8, 1988, abandoned, which is a continuation of Ser. No. 30,363, Mar. 26, 1987, abandoned.

[30] Foreign Application Priority Data

| Mar. 28, 1986 | [JP] | Japan | 61-68399 |
| Jun. 30, 1986 | [JP] | Japan | 61-153273 |
| Mar. 17, 1987 | [JP] | Japan | 62-63295 |

[51] Int. Cl.$^6$ .................................... C30B 25/04
[52] U.S. Cl. .................. 117/89; 117/90; 117/95; 117/106; 427/255.3
[58] Field of Search ............ 437/241; 427/255.3; 117/89, 90, 95, 106

[56] References Cited

U.S. PATENT DOCUMENTS

| 3,346,414 | 10/1967 | Ellis et al. | 117/106 |
| 3,493,431 | 2/1970 | Wagner | 117/93.2 |
| 3,580,732 | 5/1971 | Blakeslee et al. | 117/106 |
| 3,620,833 | 11/1971 | Gleim et al. | 117/212 |
| 3,892,608 | 7/1975 | Kuhn | 148/187 |
| 4,174,422 | 11/1979 | Matthews et al. | 428/621 |
| 4,402,771 | 9/1983 | Thomas | 156/DIG. 69 |
| 4,462,847 | 7/1984 | Thompson et al. | 156/614 |
| 4,473,598 | 9/1984 | Ephrath et al. | 427/86 |
| 4,490,208 | 12/1984 | Tanaka et al. | 156/606 |
| 4,522,662 | 6/1985 | Bradbury et al. | 156/614 |
| 4,637,127 | 1/1987 | Kurogi et al. | 156/614 |
| 4,657,603 | 4/1987 | Kruehler, et al. | 148/175 |
| 4,670,086 | 6/1987 | Leamy | 156/DIG. 88 |
| 4,671,970 | 6/1987 | Keiser et al. | 427/93 |

FOREIGN PATENT DOCUMENTS

| 0180751 | 9/1985 | European Pat. Off. . |
| 0240309 | 10/1987 | European Pat. Off. . |
| 0241104 | 10/1987 | European Pat. Off. . |
| A1537549 | 8/1968 | France . |

(List continued on next page.)

OTHER PUBLICATIONS

Gibbons et al, "CW Laser Recrystallization of 21007S; on Amorphous Substrates", Applied Physics Letters, 34(12) Jun. 15, 1979 pp. 831–832.

Claassen et al "The Nucleation of CUD Silicon on $SiO_2$ and $Si_3N_4$ Substrates" Journal of Electrochemical Society, Jan. 1980, pp. 194–202.

Jastrezebski, "SOI By CVP: Epitaxial Lateral Overgrowth (ELO) Process," Journal of Crystal Growth vol. 63 (1983) pp. 493–526.

Matthews, *Epitaxial Growth Part A* , Academic Press, N.Y. 1975 pp. 315–324.

Brice, *Crystal Growth Process* John Wiley and Sons, N.Y. Blackie Publishing 1986 pp. 75.

(List continued on next page.)

Primary Examiner—Robert Kunemund
Attorney, Agent, or Firm—Fitzpatrick, Cella, Harper & Scinto

[57] ABSTRACT

A method for forming a crystal, which comprises applying a crystal forming treatment on a substrate having a free surface on which a deposition surface ($S_{NDS}$) with a small nucleation density and a deposition surface ($S_{NDL}$) having a sufficiently small area for crystal growth only from a single nucleus and having a greater nucleation density ($ND_L$) than the nucleation density ($ND_S$) of said deposition surface ($S_{NDS}$) are arranged adjacent to each other, thereby growing a single crystal from said single nucleus.

22 Claims, 9 Drawing Sheets

FOREIGN PATENT DOCUMENTS

| | | |
|---|---|---|
| A2413126 | 7/1979 | France . |
| 55-50636 | 4/1980 | Japan ..................................... 156/610 |
| 56-24925 | 3/1981 | Japan ..................................... 156/610 |
| 58-069798 | 4/1983 | Japan . |
| 58-074034 | 5/1983 | Japan . |
| 58-116739 | 7/1983 | Japan ..................................... 156/613 |
| 58-120590 | 7/1983 | Japan ..................................... 156/614 |
| 59-069495 | 4/1984 | Japan . |
| 59-169918 | 9/1984 | Japan ..................................... 156/610 |
| 60-86096 | 5/1985 | Japan ............................. 156/DIG. 68 |
| 1131153 | 10/1968 | United Kingdom . |
| 1137046 | 12/1968 | United Kingdom . |
| 2011953 | 7/1979 | United Kingdom . |

OTHER PUBLICATIONS

P. Dobbert, et al., "Struktur auf Muskovit Aufgedampfter Kadmiumschichten" Kristall und Technik. vol. 8, No. 7, 1973, pp. 853–857.

"The Nucleation of CVD Silicon on $SiO_2$ and $Si_3 N_4$ Substrates", II. The $SiH_2Cl_2$–$H_2$–$N_2$ System by W.A.P. Classen et al.

"The Nucleation of CVD Silicon on $SiO_2$ and $Si_3N_4$ Substrates", III. The $SiH_4$–HCl–$H_2$ System at Low Temperatures by W.A.P. Claassen et al.

"Epitaxial Growth" Part A, by J.W. Matthews, pp. 12, 21, 413 and 428 (1975).

"Chemical Engineer's Handbook", 4th Ed. by John H. Perry, published by McGraw–Hill Book Company, 1963, pp. (8–2) and (8–7).

Dictionary of Scientific and Technical Terms, 4th Ed., McGraw–Hill.

METHOD FOR FORMING CRYSTAL

This application is a continuation of application Ser. No. 08/164,788 filed Dec. 10, 1993, now abandoned, which in turn, was a continuation of application Ser. No. 07/824,875 filed Jan. 24, 1992, now abandoned, which in turn, was a continuation of 07/409,284 filed Sep. 19, 1989, now abandoned which was a continuation of application Ser. No. 07/154,458 filed Feb. 8, 1988, now abandoned, which was a continuation of application Ser. No. 07/030,363 filed Mar. 26, 1987, which is now abandoned.

BACKGROUND OF THE INVENTION

1. Field of the Invention

This invention relates to a method for forming a crystal and a crystal article obtained by said method, particularly to a method for forming a single crystal or a polycrystal controlled in grain size prepared by utilizing the difference in nucleation density of the deposited materials according to the kinds of the deposited surface materials, and a crystal article obtained by said method.

The present invention is applicable to formation of a crystal such as a single crystal or a polycrystal to be used for electronic devices, optical devices, magnetic devices, piezoelectric devices or surface acoustic devices, etc., such as semiconductor integrated circuits, optical integrated circuits, magnetic circuits, etc.

2. Related Background Art

In the prior art, single crystal thin films to be used for semiconductor electronic devices or optical devices have been formed by epitaxial growth on a single crystal substrate. For example, it is known that epitaxial growth of Si, Ge, GaAs, etc., can be performed from the liquid phase, gas phase or solid phase on Si single crystal substrate (silicon wafer), and it is also known that epitaxial growth of a single crystal such as GaAs, GaAlAs, etc., occurs on a GaAs single crystal substrate. By use of the semiconductor thin film thus formed, semiconductor devices and integrated circuits, electroluminescent devices such as semiconductor lasers or LED have been prepared.

Also, much research and development has been recently made abundantly about ultra-high speed transistors by use of two-dimensional electronic gas, ultra-lattice devices utilizing quantum well, etc. what has made such research possible is the high precision epitaxial technique such as MBE (molecular beam epitaxy) or MOCVD (organometallic chemical vapor deposition) by use of ultra-high vacuum.

In such epitaxial growth on a single crystal substrate, it is necessary to take into account matching of lattice constants and coefficient of thermal expansion between the single crystal material of the substrate and the epitaxial growth layer. For example, although it is possible to effect epitaxial growth of Si single crystal thin film on sapphire which is an insulating single crystal substrate, the crystal lattice defect at the interface due to deviation in lattice constant and diffusion of aluminum which is a component of sapphire to the epitaxial layer pose problems in application to electronic devices or circuits.

Thus, the method for forming a single crystal thin film of the prior art by epitaxial growth may be understood to be dependent greatly on its substrate material. Mathews et al have examined combinations of the substrate material with epitaxial growth layer (EPITAXIAL GROWTH, Academic Press, New York, 1975, ed. by J. W. Mathews).

Also, the size of the substrate is presently about 6 inches for a Si wafer, and the enlargement of GaAs and sapphire substrate is further inhibited. In addition, since the single crystal substrate is high in production cost, the cost per chip becomes higher.

Thus, for production of a single crystal layer capable of use in a device of good quality according to the method of prior art, it is a problem that the kinds of the substrate materials are limited to an extremely narrow scope.

On the other hand, research and developments of three-dimensional integrated circuits to accomplish high integration and multi-function by laminating semiconductor devices in the normal line direction of the substrate have been made often in recent years, and also research and developments of large area semiconductor devices such as solar batteries or switching transistors of liquid crystal picture elements, etc., in which devices are arranged in an array on a cheap glass are becoming more common from year to year.

What is common to both of these is that the technique for forming a semiconductor thin film on an amorphous insulating material and forming an electronic device such as transistor, etc., thereon is required. Among them, particularly the technique for forming a single crystal semiconductor of high quality on an amorphous insulating material has been desired.

Generally speaking, when a thin film is deposited on an amorphous insulating material substrate such as $SiO_2$, etc., due to the defect of long distance order of the substrate material, the crystal structure of the deposited film becomes amorphous or polycrystalline. Here, the amorphous film refers to a state in which near distance order to the extent of the closest atoms is preserved, but no longer distance order exists, while the polycrystalline film refers to single crystal grains having no specific crystal direction gathered as separated at the grain boundaries.

For example, in the case of forming Si on $SiO_2$ according to the CVD method, if the deposition temperature is about 600° C. or lower, it becomes an amorphous silicon, while it becomes a polycrystalline silicon with grain sizes distributed between some hundred to some thousand Å at a temperature higher than said temperature. However, the grain sizes and their distribution of polycrystalline silicon will be varied greatly depending on the formation method.

Further, by melting and solidifying an amorphous or polycrystalline film by an energy beam such as laser or rod-shaped heater, etc., a polycrystalline thin film with great grain sizes of some microns or millimeters have been obtained (Single Crystal silicon on non-single-crystal insulator, Journal of crystal Growth vol. 63, No. 3, October, 1983 edited by G. W. Gullen).

When a transistor is formed on the thus formed thin film of respective crystal structures and electron mobility is measured from its characteristics, mobility of about 0.1 $cm^2$ /V·sec or less is obtained for amorphous silicon, mobility of 1 to 10 $cm^2$ /V·sec for polycrystalline silicon having grain sizes of some hundred Å, and a mobility to the same extent as in the case of single crystalline silicon for polycrystalline silicon with great grain sizes by melting and solidification.

From these results, it can be understood that there is great difference in electrical properties between the device formed in the single crystal region within the crystal grains and the device formed as bridging across the grain boundary. In other words, the deposited film on the amorphous material obtained in the prior art becomes amorphous or polycrystalline structure having grain size distribution, and the device prepared thereon is greatly inferior in its performance as compared with the device prepared on the single crystal layer. For this reason, the uses are limited to simple switching devices, solar batteries, photoelectric converting devices, etc.

On the other hand, the method for forming a polycrystalline thin film with great grain sizes by melting and solidification had problems. An enormous time is required to form the film due scanning of amorphous or single crystal thin film with energy beam for every wafer. Therefore, the technique is poor in bulk productivity, and also it is not suited for enlargement of area.

Further, in recent years, studies of diamond thin film growth are becoming popular. Diamond thin film, which is particularly broad in bandgap as 5.5 eV as the semiconductor, can be actuated at higher temperature (about 500° C. or less) as compared with Si, Ge, GaAs, etc., which are semiconductor materials of the prior art. Also, the carrier mobility of both electrons and positive holes surpass that of Si (1800 cm$^2$ /V·sec for electrons, 1600 cm$^2$ /V·sec for positive holes), and thermal conductivity is also extremely high. For this reason, it has been expected to be promising for application in semiconductor devices of the great consumption power type with great heat generation quantity.

However, although there have been reports in the prior art about epitaxial growth of diamond thin film on a diamond substrate by vapor phase growth (N. Fujimoto, T. Imai and A. Doi Pro. of Int. Couf. IPAT), there is no successful report about heteroepitaxial growth on a substrate other than diamond substrate.

Generally speaking, diamond nuclei are generated by utilizing excitation with microwaves, using a hydrocarbon type gas such as $CH_4$, etc., and by irradiation with a hot filament or an electron beam, but the nucleation density is generally low, whereby a continuous thin film can only be obtained with difficulty. Even if a continuous thin film may be formed, it has a polycrystalline structure with great grain size distribution and is difficult to apply for semiconductor devices.

Also, as long as a diamond substrate is used, it is expensive as a matter of course, posing also a problem in enlargement of area. Thus, it is not suitable for practical application.

As described above, in the crystal growth method of the prior art and for the crystal formed thereby, three-dimensional integration or enlargement of area could not be done with ease, was difficulty applied in practice for devices, and crystals such as single crystals and polycrystals, etc., required for preparation of devices having excellent characteristics could not be formed easily and at low cost.

SUMMARY OF THE INVENTION

A main object of the present invention is to provide a method for forming a crystal which has overcome the problems of the prior art as described above and a crystal article obtained by said method.

Another object of the present invention is to provide a method for forming a crystal of good quality such as single crystal containing no grain boundary or a polycrystal controlled in grain boundary, etc., without restriction with respect to the base materials, for example, without restriction with respect to materials, constitutions, sizes, etc., of the substrate, and a crystal article having the crystal obtained by said method.

Still another object of the present invention is to provide a method for forming the above crystal with good efficiency according to simple steps without use of a special device.

Still another object of the present invention is to provide a crystal article having a single crystal which is grown singly on a nucleation surface ($S_{NDL}$), which nucleation surface ($S_{NDL}$) is formed on a crystal forming surface with a material having sufficiently greater nucleation density (ND) than the material forming said crystal forming surface and has a sufficiently small area to the extent that only a single nucleus can be grown.

Still another object of the present invention is to provide a method for forming a crystal by utilizing the difference in nucleation density of the crystal forming materials according to the kinds of the materials forming the crystal forming surface, which comprises forming on said crystal forming surface a nucleation surface ($S_{NDL}$) with a material having sufficiently greater nucleation density than the material forming said crystal forming surface having a sufficiently small area so that only a single nucleus may grow thereon, forming only a single nucleus on said nucleation surface ($S_{NDL}$), and growing a single crystal from said single nucleus, thereby forming a crystal.

Still another object of the present invention is to provide a method for forming a crystal, which comprises applying a crystal forming treatment on a substrate having a free surface on which a nonnucleation surface ($S_{NDS}$) with a small nucleation density and a nucleation surface ($S_{NDL}$) having a sufficiently small area for crystal growth only from a single nucleus and having a greater nucleation density ($ND_L$) than the nucleation density ($ND_S$) of said nonnucleation surface ($S_{NDS}$) are arranged adjacent to each other, thereby growing a single crystal from said single nucleus.

Still another object of the present invention is to provide a method for forming a crystal, which comprises forming, on a substrate having a small nonnucleation surface ($S_{NDS}$) with small nucleation density at a small area for a crystal growth from only a single nucleus at a desired position of said nonnucleation surface ($S_{NDS}$), a nucleation surface ($S_{NDS}$) having greater nucleation density ($ND_L$) than the nucleation density ($ND_S$) of said nonnucleation surface ($S_{NDS}$) by addition of a material ($M_L$) for forming said deposition surface ($S_{NDS}$) which is different from the material ($M_S$) forming said nonnucleation surface ($S_{NDS}$), and then applying a crystal forming treatment on said substrate to form a single crystal nucleus on said nucleation surface ($S_{NDL}$), thereby growing a single crystal from said single nucleus.

Still another object of the present invention is to provide a method for forming a crystal, which comprises applying a crystal forming treatment on a substrate having two kinds of deposition surfaces with a sufficiently great nucleation density difference ($\Delta ND$), of which the nucleation surface ($S_{NDL}$) with smaller nucleation density has a sufficiently small area for growth of a single crystal from only a single nucleus to form a stable single nucleus on said nucleation surface ($S_{NDL}$), thereby growing a single crystal from said single nucleus.

Still another object of the present invention is to provide a crystal article, comprising a substrate having a nonnucleation surface ($S_{NDS}$) with small nucleation density and a nucleation surface ($S_{NDL}$), arranged adjacent to said nonnucleation surface ($S_{NDS}$), having a sufficiently small area for crystal growth from only a single nucleus and having greater nucleation density ($ND_L$) than the nucleation density ($ND_S$) of said nonnucleation surface ($S_{NDS}$), and a single crystal which grows from said single nucleus and covers sufficiently over said nucleation surface ($S_{NDL}$).

DETAILED DESCRIPTION OF PREFERRED EMBODIMENTS

For better understanding of the present invention, first the general process for forming a thin film of metal for semiconductor is explained.

When the deposition surface is made of a material different in kind from the depositing atom, particularly an amorphous material, the depositing atoms are diffused freely on the substrate surface, or again evaporated (released). And, as the result of collision mutually between the atoms, a nucleus is formed and when its size becomes the size rc (=−2$\sigma$o/gv) at which its free energy G becomes the maximum (critical nucleus), G is reduced and the nucleus continues to grow stably three-dimensionally to become shaped in an island. The nucleus with the size exceeding rc is called "stable nucleus", and unless otherwise particularly noted, "nucleus" in the following basic description of the present invention refers to this "stable nucleus". Also, among "stable nucleus", those with small r are called "initial nucleus".

The free energy generated by formation of nucleus is represented as follows:

$$G = 4\pi f(\theta) (\sigma o \cdot r^2 + \tfrac{1}{3} gv \cdot r^3)$$

$$f(\theta) = \tfrac{1}{4}(2 - 3\cos\theta + \cos^2\theta)$$

wherein, r: radius curvature of nucleus

θ: contact angle of nucleus gv: free energy per unit deposition

σo: surface energy between nucleus and vacuum.

Figure 1:
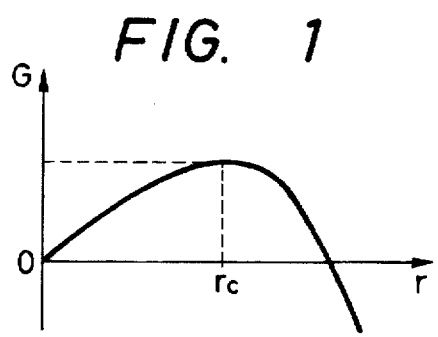
FIG. 1 is a graph for illustration of the relationship between the size of nucleus rc and free energy G in the process of forming thin film.

FIG. 1 shows the manner in which G is changed. In the same Figure, the radius of curvature of the stable nucleus when G is at the maximum value is rc.

Thus, nuclei grow to become shaped in islands, and further grow whereby contact mutually between islands progresses until sometimes coalescence occurs and via a network structure, finally a continuous film is formed to cover completely over the substrate surface. Following such a process, a thin film is deposited on the substrate.

In the deposition process as described above, the density of nucleus formed per unit area of the substrate surface, the size of nucleus and the nucleation speed are determined depending on the state of the system of deposition, and particularly the interaction between the depositing atoms and the substrate surface material is an important factor. Also, a specific crystal direction grows parallel to the substrate due to anisotropy relative to the crystal surface of the interface energy at the interface between the deposited material and the substrate. When the substrate is amorphous, the crystal direction within the substrate plane is not constant. For this reason, grain boundaries are formed by collision mutually between nuclei or islands, and particularly in the case of collision mutually between islands with some sizes or greater, grain boundaries are formed as such rather than occurrence of coalescence. Since the grain boundaries formed are difficulty movable in the solid phase, the grain sizes are determined at that point.

Next, the selective deposition method for forming a deposited film selectively on the deposition surface is to be described. The selective deposition method is a method in which a thin film is formed selectively on the substrate by utilizing the differences between the materials in factors influencing nucleus formation in the thin film forming process such as surface energy, attachment coefficient, release coefficient, surface diffusion speed, etc.

Figure 2A:
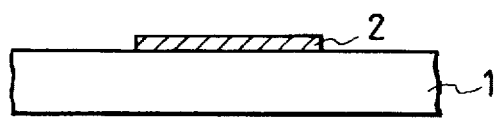
FIGS. 2A and 2B are illustrations of the selective deposition method.
Figure 2B:
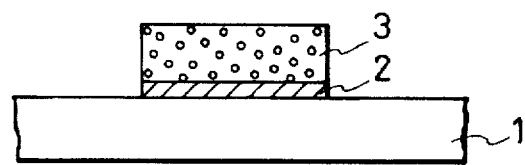

FIGS. 2A and 2B are illustrations of the selective deposition method. First, as shown in FIG. 2A on the substrate 1, a thin film 2 comprising a material different in the above factors from the substrate 1 is formed at a desired portion. When deposition of a thin film comprising an appropriate material is effected under appropriate deposition conditions, a thin film 3 grows only on the thin film 2, whereby it is possible to give rise to a phenomenon that no growth occurs on the substrate 1. By utilizing this phenomenon, the thin film 3 grows self-matchingly, whereby it becomes possible to omit the lithographic step by use of a resist as practiced in the prior art.

As the material for enabling deposition according to such selective formation method, for example, SiO$_2$ may be used as the substrate 1, Si, GaAs, silicon nitride as the thin film 2 and Si, W, GaAs, InP, etc., as the thin film 3 to be deposited.

Figure 3:
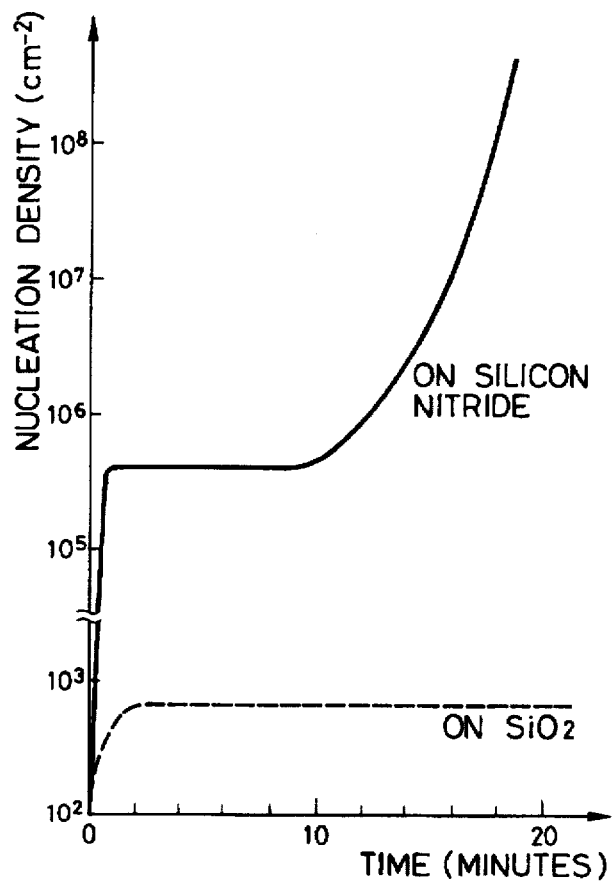
FIG. 3 is a graph showing the change with lapse of time of nucleation density (ND) on the deposition surface of SiO$_2$ and the deposition surface of silicon nitride.

FIG. 3 is a graph showing the change with lapse of time of nucleation density on the deposited surface of $SiO_2$ and the deposited surface of silicon nitride.

As shown in the same graph, soon after initiation deposition, the nucleation density on $SiO_2$ is saturated at $10^3$ $cm^{-2}$ or less, and the value is not substantially changed even after 20 minutes.

In contrast, on silicon nitride ($Si_3N_4$), it is once saturated at about $4 \times 10^5$ $cm^{-2}$ or less, is not substantially changed 10 minutes thereafter, but is abruptly increased thereafter. This measurement example shows the case in which $SiCl_4$ gas is diluted with $H_2$ and deposited according to the CVD method under the conditions of a pressure of 170 Torr and a temperature of 1000° C. Otherwise, the same action can be obtained by use of $SiH_4$, $SiH_2Cl_2$, $SiHCl_3$, $SiF_4$, etc., as the reaction gas, and controlling the pressure, temperature, etc. Also, vacuum vapor deposition can be employed.

In this case, nucleation on $SiO_2$ poses substantially no problem, but by addition of HCl gas into the reaction gas, nucleation on $SiO_2$ can be further suppressed to make deposition of Si on $SiO_2$ exactly zero.

Such a phenomenon depends greatly on the difference in adsorption coefficient, release coefficient, surface diffusion coefficient, etc., relative to Si of the material surfaces of $SiO_2$ and silicon nitride, but the fact that $SiO_2$ itself is etched by the reaction of $SiO_2$ with Si atom itself to form silicon monooxide with higher vapor pressure, while no such etching phenomenon occurs on silicon nitride may be also considered to be a cause to effect selective deposition (T. Yonehara, S. Yoshioka, S. Miyazawa, Journal of Applied Physics 53, 6839, 1982).

Thus, by selecting $SiO_2$ and silicon nitride as the materials of the deposition surface and silicon as the material to be deposited, sufficiently great nucleation density difference as shown in the same graph can be obtained. Here, although $SiO_2$ is desirable as the material for the deposition surface, this is not limitative and sufficiently practical nucleation density difference can be obtained even by use of $SiO_x$ ($0 < x < 2$).

Of course, the present invention is not limited to these materials, but the difference in nucleation density ($\Delta ND$) may be sufficiently $10^3$-fold or more in density of nuclei as shown by the same graph, and sufficient selective formation of deposited film can be done with the materials as exemplified below.

As another method for obtaining this nucleation density difference ($\Delta ND$), ions of Si or N may be injected locally into the $SiO_2$ surface to form a region having excessive Si or N.

The present invention utilizes selective deposition based on such nucleation density difference ($\Delta ND$) and, by forming sufficiently finely so that a single nucleus may grow on the deposition surface of a different kind of material having sufficiently greater nucleation density than the material of the deposition surface, a single crystal can be grown selectively only at the site where such fine different kind of material exists.

In this connection, since selective growth of a single crystal is determined depending on the electron state of the deposition surface, particularly the state of dangling bonds, the material with lower nucleation density (for example, $SiO_2$) is not required to be a bulk material, but it may be formed only on the surface of any desired material, substrate, etc., to form the above deposited surface.

In the following, the present invention is described in detail by referring to the drawings.

Figure 4A:
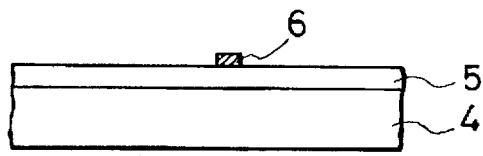
FIGS. 4A to 4D are illustrations of the formation steps showing a first embodiment of the method for forming crystal according to the present invention.
Figure 4B:
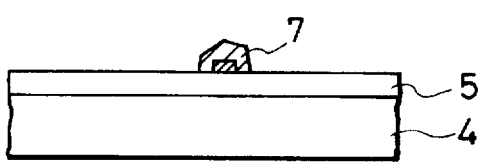
Figure 4C:
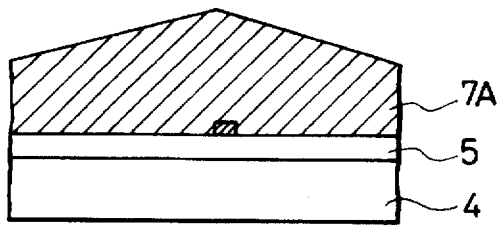
Figure 4D:
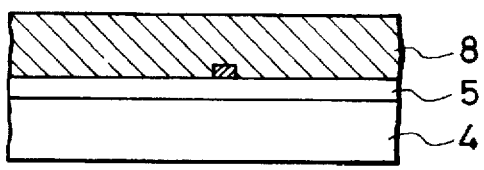
Figure 5A:
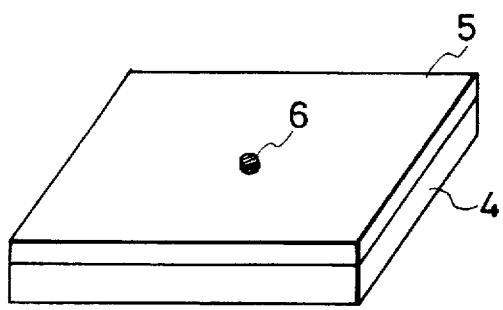
FIGS. 5A and 5B are perspective views of the substrate in FIGS. 4A to 4D.
Figure 5B:
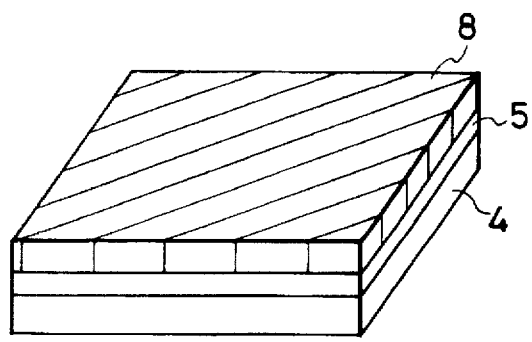
Figure 6A:
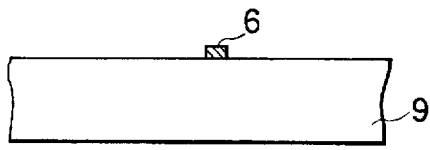
FIGS. 6A to 6D are illustrations of the steps for forming crystal showing a second embodiment of the present invention.

FIGS. 4A to 4D are illustrations of the formation steps showing a first embodiment of the method for forming crystal according to the present invention, and FIGS. 5A and 5B are perspective views of the substrates in FIGS. 4A and 4D. First, as shown in FIG. 4A and FIG. 5A, on the substrate 4, a thin film 5 [deposition surface ($S_{NDS}$)] with small nucleation density which enables selective deposition is formed and a material different from the material forming the thin film 5 with greater nucleation density is deposited thinly, followed by patterning according to lithography, etc., to form a sufficiently fine deposition surface 6 ($S_{NDL}$) comprising a different kind of material. However, the size, the crystal structure and the composition of the substrate 4 may be any desired ones, and a substrate having a functional device formed thereon prepared according to conventional semiconductor technique may be employed. Also, the deposition surface ($S_{NDL}$) 6 comprising a different kind of material is also inclusive of modified regions having excessive Si or N formed by ion injection of Si or N into the thin film 5 as described above.

Next, by selection of appropriate deposition conditions, a single crystal of a thin film material is formed only on the deposition surface ($S_{NDL}$) 6. That is, the deposition surface ($S_{NDL}$) 6 is required to be formed sufficiently finely so that only a single nucleus may be formed thereon. The size of the deposition surface ($S_{NDL}$) 6, which may differ depending on the kind of the material, may be several microns or less. Further, the nucleus grows while maintaining a single crystal structure to become a single crystal grain 7 in shape of an island as shown in FIG. 4B. For forming an island-shaped single crystal grain 7, it is desirable to determine the conditions so that no nucleation may occur at all on the thin film 5, as already mentioned.

The island-shaped single crystal grain 7 further grows while maintaining the single crystal structure with the deposition surface ($S_{NDL}$) 6 as the center (lateral overgrowth), whereby it can cover over the whole thin film 5 as shown in FIG. 4C (single crystal 7A).

Subsequently, if necessary, the single crystal 7A is flattened by etching or polishing, and a single crystal layer 8 capable of forming a desired device can be formed on the thin film 5 as shown in FIG. 4D and FIG. 5B.

For forming thus the thin film 5 forming the nonnucleation surface ($S_{NDS}$) on the substrate 4, any desired material can be used for the substrate 4 which is the supporting member. Further, in such a case, even when the substrate 4 may be one having a functional device, etc., formed thereon according to conventional semiconductor technique, the single crystal layer 8 can be easily formed thereon.

In the above embodiment, the nonnucleation surface ($S_{NDS}$) is formed of thin film 5, but a substrate comprising a material with small nucleation density (ND) enabling selective nucleation may be used as such and nucleation surfaces ($S_{NDL}$) may be provided at any desired positions to form single crystal layers similarly thereon.

FIGS. 6A–6D are illustrations of the steps for forming crystal showing a second embodiment of the present invention. As shown in these figures, on a substrate 9 comprising a material with small nucleation density (ND) enabling selective nucleation, the nucleation surface ($S_{NDL}$) comprising a material with great nucleation density (ND) can be formed sufficiently finely to form a single crystal layer 8 similarly as in the first embodiment.

Figure 7A:
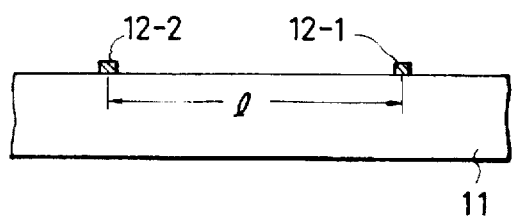
FIGS. 7A to 7D are illustrations of the formation steps showing a third embodiment of the method for forming single crystal according to the present invention.
Figure 6B:
Figure 7B:
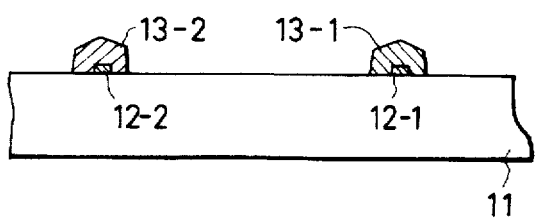
Figure 6C:
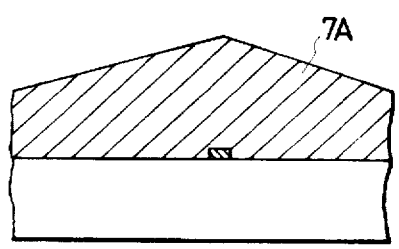
Figure 7C:
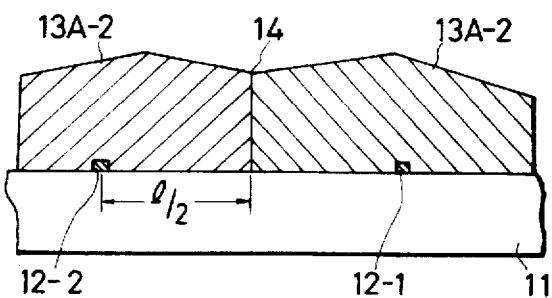
Figure 6D:
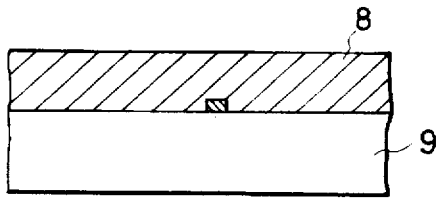
Figure 7D:
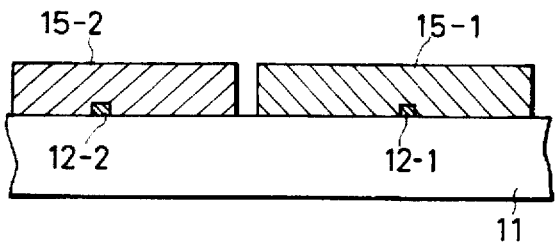
Figure 9A:
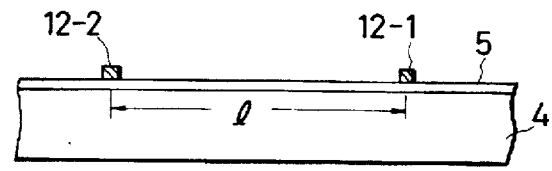
FIGS. 9A to 9D are illustrations of the steps for forming crystal showing a fourth embodiment of the present invention.
Figure 8A:
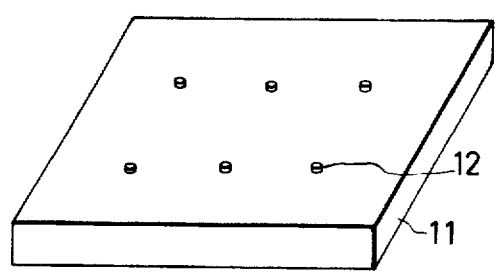
FIGS. 8A to 8B are perspective views of the substrates in FIGS. 7A to 7B.
Figure 8B:
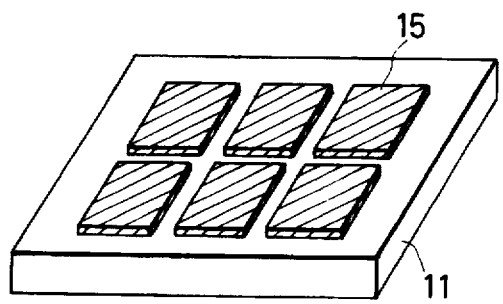

FIGS. 7A–7D are illustrations of the formation steps showing a third embodiment of the method for forming crystal according to the present invention, and FIGS. 8A and 8B are perspective views of the substrates in FIGS. 7A and 7D.

As shown in FIG. 7A and FIG. 8A, on the amorphous insulating substrate 11, with an interval of a distance l, nucleation surfaces ($S_{NDL}$) 12-1, 12-2 of a material different from the substrate 11 enabling the above selective nucleation are arranged sufficiently finely. The distance l is set equal to the size of the single crystal region required for formation of semiconductor device or group of devices or greater.

Next, by selecting appropriate crystal forming conditions, on the nucleation surfaces ($S_{NDL}$) 12-1, 12-2 only a nucleus of a crystal forming material is formed. That is, the nucleation surfaces 12-1, 12-2 are required to be formed to a sufficiently fine size (area) to the extent that only a single nucleus may be formed. The size of the nucleation surfaces ($S_{NDL}$) 12-1, 12-2, which may be different depending on the kind of the material, may be several microns or less. Further, the nucleus grows while maintaining the single crystal structure, and become island-shaped single crystal grains 13-1, 13-2 as shown in FIG. 7B. For forming island-shaped single crystal grains 13-1, 13-2, it is desirable to determine the conditions so that no nucleation may occur at all on other surfaces than the nucleation surfaces ($S_{NDL}$) on the substrate 11.

The crystal direction in the normal line direction of the substrate 11 of the island-shaped single crystal grains 13-1, 13-2 is determined so as to make the interface energy of the material of the substrate 11 and the material forming nucleus minimum. That is because surface or interface energy has anisotropy depending on the crystal face. However, as already mentioned, the crystal direction within the substrate plane in amorphous substrate is not determined.

The island-shaped single crystal grains 13-1, 13-2 further grow to become single crystals 13A-1, 13A-2 until the adjacent single crystals 13A-1, 13A-2 contact each other as shown in FIG. 7C, but since the crystal direction within the substrate plane is not constant, a crystal grain boundary 14 is formed at the intermediate position between the nucleation surfaces ($S_{NDL}$) 12-1 and 12-2.

Subsequently, the single crystals 13A-1, 13A-2 grow three-dimensionally, but crystal faces with slow growth speed appear as the fact. For this reason, the surfaces of single crystals 13A-1, 13A-2 are flattened by etching or polishing, and further the portion of the grain boundary 14 is removed to form thin films of single crystals 15-1, 15-2 containing no grain boundary in shape of lattices as shown in FIG. 7D and FIG. 8B. The size of the single crystal films 15-1, 15-2, 15 is determined by the interval l between the nucleation surfaces ($S_{NDL}$) as described above. That is, by determining appropriately the formation pattern of the nucleation surface ($S_{NDL}$) 12, the position of the grain boundary can be controlled to form single crystals with desired sizes at a desired arrangement.

FIGS. 9A-9D are illustration of the steps for forming crystal showing a fourth embodiment of the present invention. As shown in these figures, similarly as in the first embodiment, a nonnucleation surface ($S_{NDS}$) 5 shaped in a thin film comprising a material with small nucleation density (ND) enabling selective nucleation is formed on a desired substrate 4, and a nucleation surfaces ($S_{NDL}$) 12 comprising a different material with greater nucleation density (ND) are formed at intervals of l thereon, whereby single crystal layers 15 can be formed similarly as in the above third embodiment.

Figure 10A:
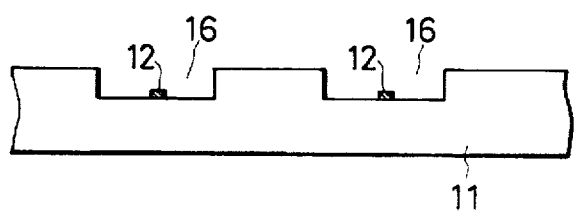
FIGS. 10A to 10C are illustrations of formation steps showing a fifth embodiment of the method for forming crystal according to the present invention.
Figure 10B:
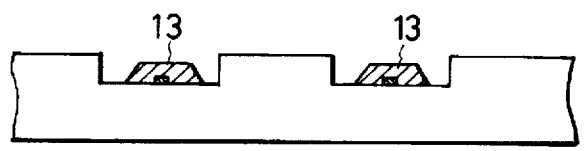
Figure 10C:
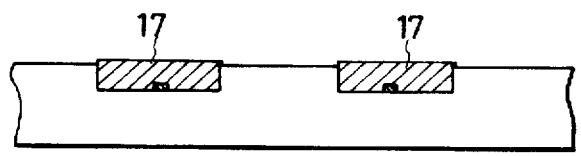
Figure 11A:
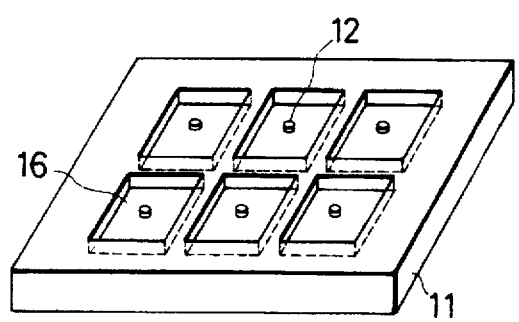
FIGS. 11A to 11B are perspective views of the substrates in FIGS. 10A to 10C.
Figure 11B:
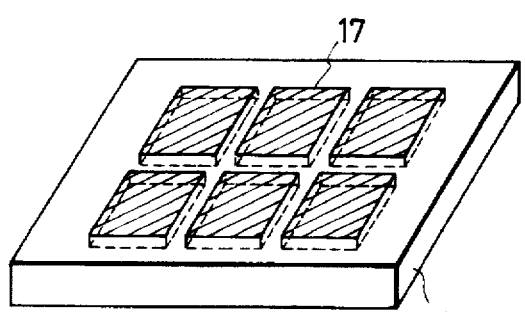

FIGS. 10A-10C are illustrations of the formation steps showing a fifth embodiment of the method for forming crystal according to the present invention, and FIGS. 11A and 11b are perspective views of the substrates in FIGS. 10A and 10C. First, as shown in FIG. 10A and FIG. 11A, concavities 16 with desired size and shape are formed on the amorphous insulating substrate 11, and nucleation surfaces ($S_{NDL}$) 12 with sufficiently fine size for forming only single nucleus are formed therein.

Subsequently, as shown in FIG. 10, island-shaped single crystal grains 13 are grown similarly, as in the first embodiment.

And, as shown in FIG. 10C and FIG. 11B, single crystal grains 13 are grown until embedding the concavity 16 to form a single crystal layer 17.

In this embodiment, since single crystal grains 13 grow within the concavity 16, the steps of flattening and removing the grain portion become unnecessary.

Figure 12A:
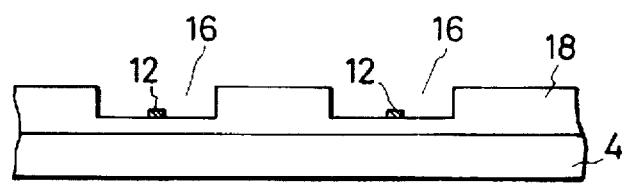
FIGS. 12A to 12C are illustrations of the steps for forming crystal showing a sixth embodiment of the present invention.
Figure 12B:
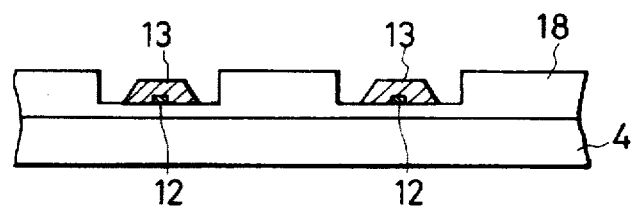
Figure 12C:
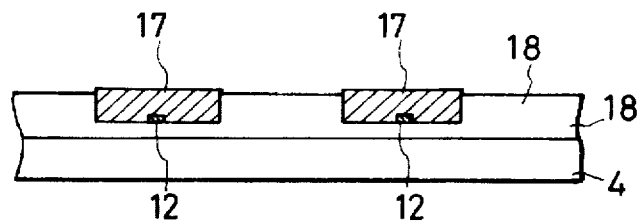

FIGS. 12A-12C are steps for forming crystal showing a sixth embodiment of the present invention. As shown in the same Figure, on any desired substrate 4 similarly as in the first embodiment, a nonnucleation surface ($S_{NDS}$) shaped in thin film 18 comprising a material with small nucleation density (ND) enabling selective nucleation is formed, and a concavity 16 with desired size and shape is formed thereon. And, a nucleation surface ($S_{NDL}$) 12 comprising a material different from the material forming the nonnucleation surface ($S_{NDS}$) with greater nucleation density (ND) is formed therein, and a single crystal layer 17 is formed similarly as in the fifth embodiment.

Figure 13A:
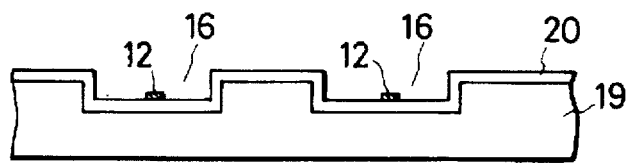
FIGS. 13A to 13C are illustrations of the steps for forming crystal showing a seventh embodiment of the present invention.
Figure 13B:
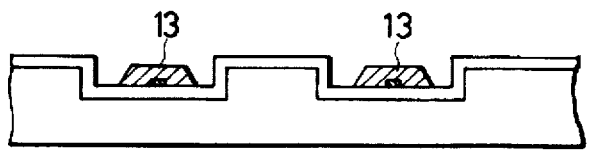
Figure 13C:
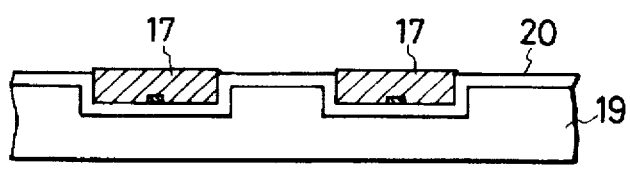

FIGS. 13A-13C are illustrations of the steps for forming crystal showing a seventh embodiment of the present invention. After formation of concavities on a desired substrate 19, nonnucleation surface ($S_{NDS}$) 20 shaped in a thin film comprising a material with sufficient small nucleation density (ND) enabling selective nucleation is formed, and following the same procedure as in the foregoing embodiments, single crystal layers 17 can be formed.

Figure 14:
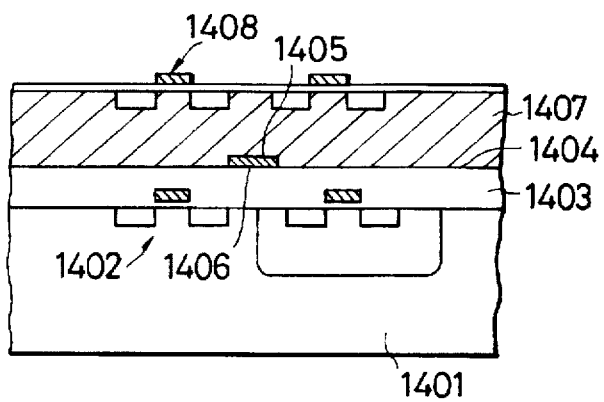
FIG. 14 is a schematic sectional view showing an example of the multi-layer structure by use of the first embodiment of the present invention.

FIG. 14 is a schematic sectional view showing an example of the semiconductor electronic device with a multi-layer structure produced by use of the first embodiment of the present invention.

In FIG. 14, on the semiconductor substrate 1401 such as Si or GaAs, transistors 1402 or other semi-conductor devices or optical devices are formed, and $SiO_2$ layer 1403 having, for example, nonnucleation surface ($S_{NDS}$) 1404 is formed thereon according to the CVD method or the sputtering method. And, as already mentioned, a thin film 1406 having nucleation surface ($S_{NDL}$) 1405 having sufficiently fine area so that only a single nucleus may be formed is formed of, for example, $Si_3H_4$ and from said nucleation surface ($S_{NDL}$) 1405 single crystal layer 1407 is formed.

Subsequently, on the single crystal layer 1407 are formed transistors 1408 or other semiconductor devices or optical devices, and the devices formed respectively on the substrate 1401 and the Si single crystal layer 1407 are electrically connected through the $SiO_2$ layer 1403. Thus, for example, by forming the transistor 1402 of the first layer (substrate 1401) and the transistor of the second layer (single crystal layer 1404) respectively as the MOS transistors, and connecting these to form CMOS, a SMOS entirely free from mutual interaction can be produced. Also, according to the technique as described above, an electroluminescent device can be also formed integrated with its driving circuit to accomplish a high degree of integration.

Further, by repeating this embodiment, single crystal layers 1407 can be formed in many layers with $SiO_2$ layer 1403 sandwiched therebetween, whereby a semiconductor electronic device with a multiple structure can be formed easily.

FIGS. 15A-15D are illustrations of the steps for forming crystal showing an eighth embodiment of the present invention.

Figure 15A:
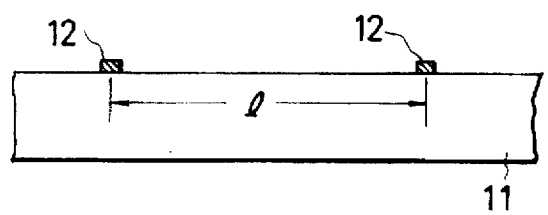
FIGS. 15A to 15D are illustrations of the steps for forming crystal showing an eighth embodiment of the present invention.
Figure 15B:
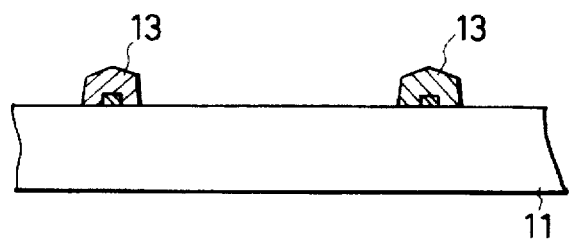
Figure 15C:
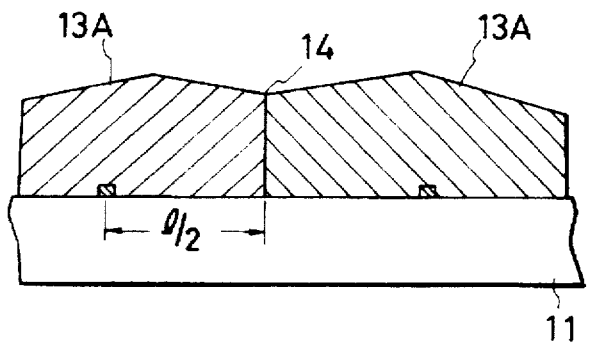
Figure 15D:
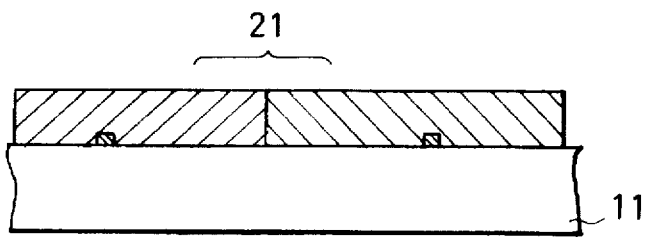

FIGS. 15A-15C are the same as FIGS. 7A-7C. That is, a plurality (two in the Figure) of nucleation surfaces 12 are formed with an interval of 1, and single crystal grains 13 subjected to overgrowth on the nucleation surfaces 12 are formed. By permitting the single crystal grains 13 to further grow to form single crystals 13A, a grain boundary 14 is formed approximately at the center between the nucleation surfaces ($S_{NDL}$), and by flattening the surface of single crystal 13A, a polycrystalline layer 21 with regular grains sizes which are approximately equal to 1 as shown in FIG. 15 can be obtained. Since the grain size of the polycrystalline, layer 21 is determined by the interval 1 between the nucleation surfaces ($S_{NDL}$) 12, it becomes possible to control the grain size of the polycrystal. In the prior art, the grain size of a polycrystal was changed by a plural number of factors such as the formation method, formation temperature, etc., and also when preparing a polycrystal with large grain size, it had a grain size distribution with a considerable width. However, according to the present invention, the grain size and grain size distribution can be determined with good controllability by the interval 1 between the nucleation surfaces 12.

Of course, as shown in FIG. 9, the above polycrystal layer 21 may be formed by forming a nonnucleation surface ($S_{NDS}$) 5 with small nucleation density (ND) on a desired substrate 4 and nucleation surfaces ($S_{NDL}$) 12-1, 12-2 with greater nucleation density (ND). In this case, as already mentioned, the substrate material and structure are not limited, but the polycrystal layer 21 can be formed by controlling the grain size and the grain size distribution.

Next, the specific method for forming a single crystal layer or a polycrystal layer in the above respective embodiments is described in more detail by referring primarily to the third embodiment shown in FIG. 7 and the eighth embodiment shown in FIG. 15.

By thermal oxidation of a Si single crystal wafer to form $SiO_2$ on the surface, a substrate 11 is obtained with its surface being formed into nonnucleation surface ($S_{NDS}$). Of course, a quartz substrate which is a material with small nucleation density (ND) can be also used as the substrate 11t or alternatively nonnucleation surface ($S_{NDS}$) may be provided by forming $SiO_2$ layer on the surface of any desired base substrate such as metal, semiconductor, magnetic material, piezoelectric material, insulator, etc., by use of the sputtering method, the CVD method, the vacuum vapor deposition method, etc. Also, as the material forming nonnucleation surface ($S_{NDS}$) $SiO_2$ is desirable but $SiO_x$ ($0<x<nx1$) with the value of x being varied may be also employed.

On the $SiO_2$ layer of the substrate 11 having $SiO_2$ layer thus formed on the surface is deposited as silicon nitride layer (e.g. $Si_3N_4$ layer) or a polycrystalline silicon layer according to the reduced pressure chemical vapor deposition method, and subsequently the silicon nitride layer or polycrystalline silicon layer is subjected to patterning according to conventional lithographic technique or lithographic technique by use of X-ray, electron beam or ion beam, whereby nucleation surfaces ($S_{NDL}$) 12 having fine area of preferably 10 μm or less, in maximum diameter more preferably several micron or less, optimally about 1 μm or less, are obtained.

Subsequently, by use of $SiH_2Cl_2$, $SiCl_4$, $SiHCl_3$, $SiF_4$ or $SiH_4$, or a gas mixture of these, optionally mixed with HCl, $H_2$ or a gas mixture of these, Si single crystal is selectively grown on the above substrate 11.

The substrate temperature, pressure, etc., may be conveniently determined, but the substrate temperature may be preferably 700° to 1100° C. and the pressure may be preferably about 100 Torr.

Within a time of about some 10 minutes, by selection of optimum growth conditions, grains 13 of single crystals of Si grow on the nucleation surfaces ($S_{NDS}$) 12 comprising silicon nitride layer or polycrystalline silicon layer on the $SiO_2$ layer as the center, and grow to sizes of some 10 μm or more.

Subsequently, by the reactive ion etching (RIE) method utilizing the etching speed difference between Si and $SiO_2$, the surface of the single crystal 13A is flattened by selective etching of only Si, whereby a polycrystalline silicon layer 21 controlled in grain size can be formed (FIG. 15 D). Further, by removing the grain boundary portion, an island-shaped single crystalline silicon layer 15 is formed (FIG. 7 D). If unevenness on the surface of the single crystal grain 13 is large, mechanical polishing may be conducted before etching. When an electrical field effect transistor is formed according to conventional semiconductor device preparation techniques on the single crystal silicon layer 15 thus formed with a size of some 10 μm or more containing no grain boundary, characteristics not inferior to that formed on a single silicon wafer are exhibited.

Also, mutual interference between the adjacent single crystal silicon layers 15 can be prevented, if they are electrically separated by an electrical insulator such as $SiO_2$, even if a complementary type electrical field effect transistor (C-MOS) may be constituted.

Also, since the thickness of the active layer of the device formed is thinner than the case when employing Si wafer, there is no erroneous actuation by the charges generated when radiation is irradiated. Further, due to lowering in unwanted capacity, speed-up of the device can be effected. Also, since any desired substrate can be used, a single crystal layer can be formed on a substrate of large area at lower cost than when employing Si wafer. Further, since a single crystal layer can be formed also on other semiconductors, piezoelectric materials, dielectric materials, etc., a multifunctional three-dimensional integrated circuit can be realized. Thus, the present invention exhibits a number of excellent effects.

(Composition of silicon nitride)

For obtaining sufficient nucleation density difference (ΔND) between the material for formation of nonnucleation surface ($S_{NDS}$) and the material for formation of nucleation surface ($S_{NDL}$) as described above, for polycrystalline silicon or $SiO_2$ as the material for formation of nonnucleation surface ($S_{NDS}$) to be used in combination, the material for formation of nucleation surface ($S_{NDL}$) is not limited to $Si_3N_4$, but silicon nitrides with various chemical composition ratios may be employed.

The chemical composition ratio of silicon nitride may be varied as follows.

In the plasma CVD method for forming silicon nitride film at low temperature by decomposition of $SiH_4$ gas and $NH_3$ gas in RF plasma, by varying the flow rate ratio of $SiH_4$ gas and $NH_3$ gas, the composition ratio of Si and N in the deposited silicon nitride film can be varied to a great extent.

Figure 16:
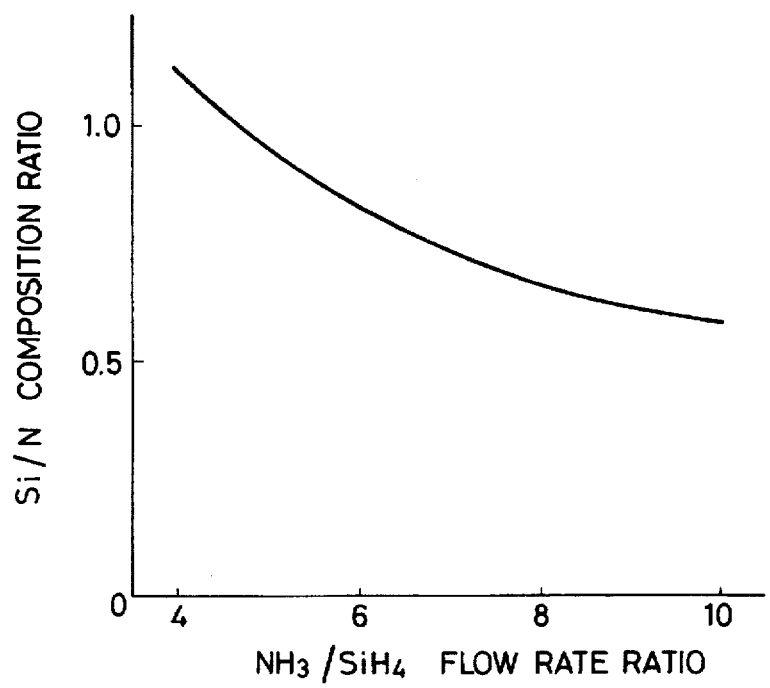
FIG. 16 is a graph showing the relationship between the flow rate of SiH$_4$ and NH$_3$ and the composition ratio of Si and N in the silicon nitride film formed.

FIG. 16 is a graph showing an example of the relationship between the flow rate ratio of $SiH_4$ and $NH_3$ and the composition ratio of Si and N in the silicon nitride film formed.

The deposition conditions at this time were RF output of 175 W, substrate temperature of 380° C. and the flow rate of $NH_3$ gas was varied with the $SiH_4$ gas flow rate being fixed at cc/min. As shown in the same graph, by varying the gas flow rate ratio of $NH_3/SiH_4$ from 4 to 10, the Si/N ratio in the silicon nitride film was found to be varied from 1.1 to 0.58 according to Auger's electron spectrophotometry.

On the other hand, the composition of the silicon nitride film formed according to the reduced pressure CVD method by introducing $SiH_2Cl2$ gas and $NH_3$ gas under the conditions of a reduced pressure of 0.3 Torr and a temperature of about 800° C. was found to be $Si_3N_4$ (Si/N=0.75) which is approximately the stoichiometric ratio.

Also, the silicon nitride film formed by heat treatment at about 1200° C. in ammonia or $N_2$ (hot nitrification method) can be obtained with a composition further approximate to the stoichiometric ratio, since the formation method is performed under thermal equilibrium.

By use of silicon nitrides formed by the various methods as described above as the material for forming nucleation surface ($S_{NDL}$) with higher nucleation density than $SiO_2$, the above nucleus of Si can be grown on the nucleation surface ($S_{NDL}$) comprising silicon nitride to form Si single crystal based on the nucleation density ($\Delta ND$) corresponding to the chemical composition ratio of silicon nitride.

Figure 17:
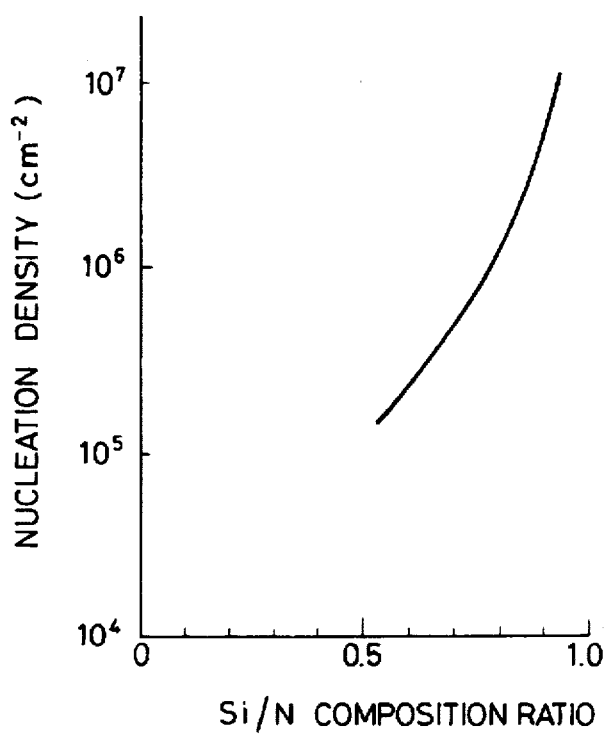
FIG. 17 is a graph showing the relationship between Si/N composition ratio and nucleation density.

FIG. 17 is a graph showing the relationship between Si/N composition ratio and nucleation density ($\Delta ND$). As shown in the same graph, by varying the chemical composition ratio of the silicon nitride film, the nucleation density of the Si single crystal nucleus formed thereon changes to a great extent. The nucleation conditions in the graph shown in FIG. 17 correspond to the case when Si single crystal nucleus was formed by reacting $SiCl_4$ gas reduced to 175 Torr with $H_2$ at 1000° C. Of course, another graph will be obtained if nucleation conditions such as gas species, pressure, temperature, etc., are changed.

The phenomenon that the nucleation density thus changes according to the chemical composition ratio of silicon nitride affects the size (area) of the nucleation surface ($S_{NDL}$) when employing silicon nitride as the material for forming the nucleation surface ($S_{NDL}$) which is formed sufficiently finely to the extent that a single nucleus may be grown. That is, when employing silicon nitride having a composition with great nucleation density (ND) only a single crystal can be formed on the nucleation surface ($S_{NDL}$) by forming the nucleation surface ($S_{NDL}$) extremely finely as compared with the silicon nitride with relatively smaller nucleation density (ND). Such a point is applicable as a similar tendency for other materials for forming nucleation surface ($S_{NDL}$). Accordingly, in the present invention, for accomplishing its objects effectively, it is desirable to select a nucleation density (ND) and a size of nucleation surface ($S_{NDL}$) formed of silicon, nitride, etc., capable of forming only a single crystal suitably as desired. For example, under the nucleation condition for obtaining a nucleation density (ND) of about $10^5$ cm$^{-2}$ or less, it is possible to form selectively, only a single nucleus, if the size of the nucleation surface ($S_{NDL}$) comprising silicon nitride is about 4 μm or less. The Si/N ratio in that case is about 0.5.

(Formation of nucleation surface ($S_{NDL}$) by ion injection)

As another method for realizing nucleation density difference when forming Si single crystal nucleus, ion injection of Si, N, P, B, F, Ar, He, C, As, Ga, Ge, etc., may be effected locally onto the surface comprising $SiO_2$ which is a material for forming nonnucleation surface ($S_{NDS}$) with smaller nucleation density to form a modified region with a desired size on the $SiO_2$ surface, and utilize this modified region as the nucleation surface ($S_{NDL}$) with greater nucleation density (ND).

For example, the $SiO_2$ layer surface is covered with a photoresist layer and the desired portions are exposed, developed and dissolved to have the $SiO_2$ layer surface exposed.

Subsequently, by use of $SiF_4$ gas as the source gas, Si ions are implanted onto the $SiO_2$ layer surface exposed at 10 keV at a density of $1 \times 10^{16} \sim 1 \times 10^{18}$ cm$^{-2}$. The projected depositing distance in this case is 114 Å, and the Si concentration on the exposed surface of $SiO_2$ layer reaches about $10^{22}$ cm$^{-3}$ or less. Since the $SiO_2$ layer is originally amorphous, the modified layer made excessively enriched in Si by injection of Si ions is also amorphous.

For formation of a modified region, ion injection can be effected with the use of a resist as the mask, but it is also possible to inject a narrowed Si ion beam selectively at a desired position on the $SiO_2$ layer surface within a desired area without use of a resist mark by use of converged ion beam technique.

After having thus effected Si ion injection, by peeling of the resist on the remaining portion, Si-excessive modified region is formed on the $SiO_2$ layer surface at a desired position with a desired size. On the modified region of the $SiO_2$ layer surface having such modified region formed, Si single crystal is permitted to grow in vapor phase.

Figure 18:
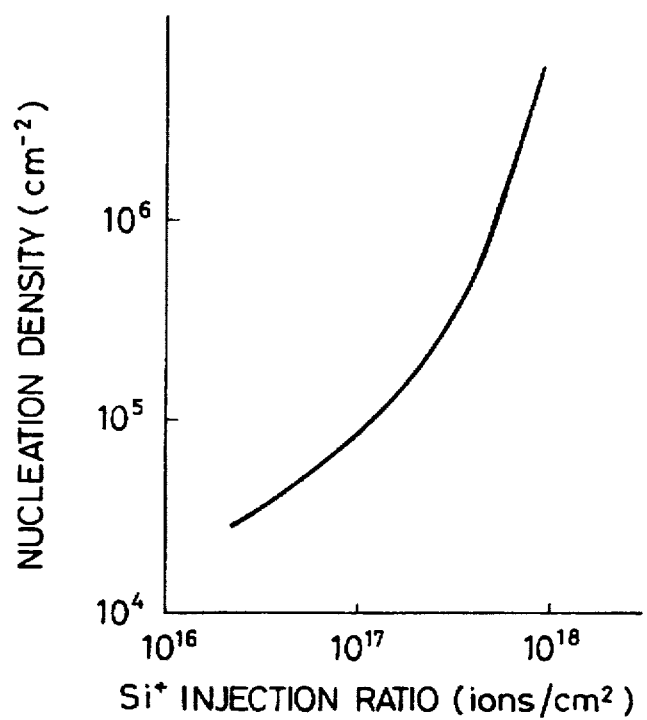
FIG. 18 is a graph showing the relationship between the injected amount of Si ions and nucleation density.

FIG. 18 is a graph showing the relationship between amount of Si ions injected and nucleation density (ND).

As shown in the same graph, it can be understood that nucleation density (ND) is increased as the amount of $Si^{30}$ injected is more.

Accordingly, by forming a modified region sufficiently finely, only a single nucleus of Si can be grown with the modified region being as the nucleation surface ($S_{NDL}$), whereby a single crystal can be grown as described above.

It can be easily accomplished by patterning of a resist or narrowing of beam of the converged ion beam to form sufficiently finely the modified region to the extent that only a single nucleus may grow.

(Method for formation of Si single crystal nucleus other than CVD)

For growth of single crystal by selective nucleation of Si, not only the CVD method, but also the method by evaporation of Si into vacuum ($<10^{-6}$ Torr) with an electron gun and deposition on a heated substrate may be used. Particularly, in the MBE (Molecular Beam Epitaxy) method which performs vapor deposition in ultra-high vacuum ($<10^{-9}$ Torr), it has been known that Si beam begins to react with $SiO_2$ at a substrate temperature of 900° C. or higher, whereby no nucleation of Si occurs on $SiC_2$ at all (T. Yonehara, S. Yoshioka and S. Miyazawa, Journal of Applied Physics 53, 10, p. 6839, 1983).

By utilizing this phenomenon, single crystal nuclei of Si can be formed with perfect selectivity on the fine silicon nitride regions permitted to exist in spots on the $SiC_2$ layer, and single crystal Si can be grown thereon. The single crystal growth conditions as preferable example at this time may be, for example, a vacuum degree of $10^{-8}$ Torr or lower, Si beam intensity of $9.7 \times 10^{14}$ atoms/cm$^2$·sec, and a substrate temperature of 900° C. ~1000° C.

In this case, through the reaction $SiO_2 + Si \rightarrow 2SiO\uparrow$, a reaction product of SiC with a remarkably high vapor pressure is formed, and etching of $SiC_2$ itself with Si through this evaporation occurs.

In contrast, no such etching phenomenon as mentioned above occurs on silicon nitride, but nucleation of Si single crystal and growth of single crystal occur.

Accordingly, as the material for forming nucleation surface ($S_{NDL}$) with high nucleation density (ND), tantalum oxide ($Ta_2O_5$), silicon nitride oxide (SiON), etc., can be also used other than silicon nitride to obtain the same effect. That is, by forming the above nucleation surface ($S_{NDL}$) with these materials in fine areas, single crystals of Si can be permitted to grow similarly.

(Crystal growth of material other than Si)

(1) As the crystalline material other than Si, the case of diamond is shown as an Example, as already mentioned, it has been desired to apply a diamond thin film as the semiconductor for electronic device, it has been impossible in the prior art to grow a diamond single crystal on a material other than the diamond substrate.

However, according to the crystal growth method according to the present invention, a diamond single crystal can be easily grown on a material other than diamond substrate. Here, explanation is made about an example of forming a single crystal of diamond by utilizing the fact that no single crystal nucleus of diamond grows on the surface of a metal such as Fe or Co.

First, on a desired base substrate, a metal layer of Fe or Co is formed by the vacuum vapor deposition method. In this case, the metal layer becomes a polycrystalline structure. This metal layer forms the nonnucleation surface ($S_{NDS}$) with lower nucleation density (ND) as mentioned in the present specification.

Subsequently, on the above metal layer, a metal such as Cu, W, Ta, Mo, Au, Ti, Al, Ni, etc., is deposited according to the vacuum vapor deposition method, or a semiconductor material such as Si, Ge, GaAs, InP, SiC, etc., according to the CVD method or the vacuum vapor deposition method. These metal and semiconductor materials are materials having sufficiently higher nucleation density as compared with the above metal layer. Subsequently, this metal or semiconductor layer is subjected to patterning to a size of several micrometer to form a nucleation surface ($S_{NDL}$) with a sufficiently fine area. Alternatively, the nucleation surface ($S_{NDL}$) comprising the above metal or semiconductor material may be formed by ion injection of the material as mentioned previously.

Thus, diamond is crystallized on the metal layer where nucleation surface exists under the following conditions.

As the method for crystallization of diamond, there may be employed the CVD method according to the microwave plasma CVD method, the hot filament method, etc. As the starting gases, for example, there may be employed gas mixtures of methane ($CH_4$) and hydrogen (1 ~10%), or hydrocarbons having alcoholic OH groups, specifically methyl alcohol $CH_3$ OH, ethyl alcohol $C_2H_5OH$, tert-butyl alcohol $(CH_3)_3$ OH, isopropyl alcohol $(CH_3)_2CHOH$, diethyl ether $C_2H_5OC_2H_5$, etc., by bubbling these liquids with hydrogen gas.

In the case of the plasma CVD method, it can be practiced, for example, under the conditions of a microwave output of 200 to 350 W, a substrate temperature of 500° to 1000° C. and a reduced pressure of 1 to 400 Torr.

In the case of the CVD method by use of the hot filament method, it can be practiced, for example, under the conditions of a filament temperature of about 1500° to 2000° C. and a filament-substrate distance of 0.5 to 10 mm.

As the result, no nucleation of diamond occurs at all on the metal layer of Fe or Co, but only a single diamond single crystal nucleus is formed on the nucleation surface ($S_{NDL}$) with higher nucleation density (ND) finely formed on its surface, and thereafter diamond grains of single crystals grow to the sizes of some 10 µm to some 100 µm with the single diamond nuclei as their centers. In these diamond grains, there may sometimes exist internally the twin crystal grain boundaries without unpaired electrons depending on the crystal forming conditions, but there exists no grain boundary containing much unpaired electrons as found in the so called polycrystalline structure. This is because growth of a diamond single crystal from a single nucleus formed on the nucleation surface ($S_{NDL}$) is not inhibited due to absence of formation of diamond nucleus on the nonnucleation surface ($S_{NDS}$) formed of a material such as Fe or Co with lower nucleation density.

Figure 19:
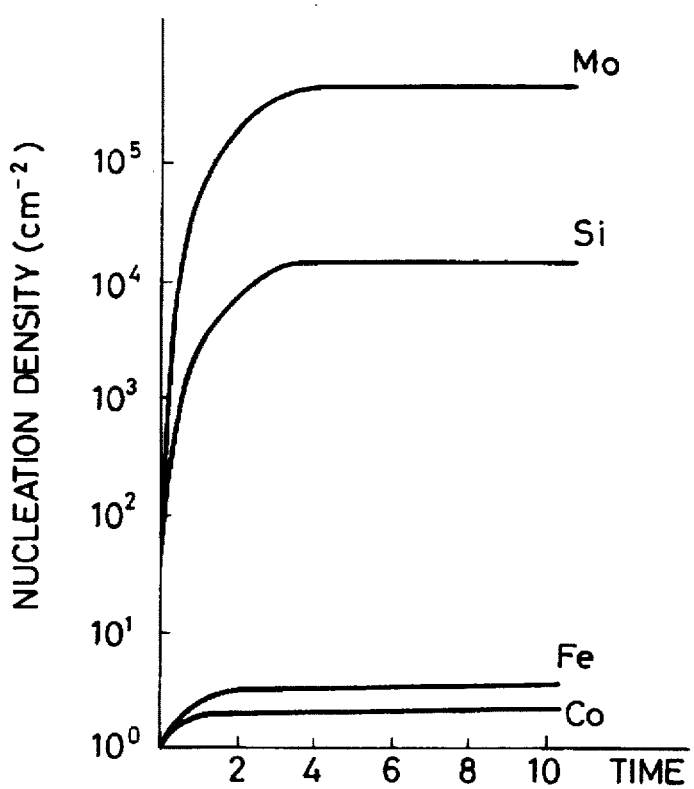
FIG. 19 is a graph showing the time dependency of nucleation density of diamond nuclei on Fe, Co, Si and Mo.

FIG. 19 is a graph showing the time dependency of nucleation density of the diamond on the surface of Fe, Co, Si, Mo.

As shown in this graph, it is possible to take sufficiently a difference in nucleation density of diamond on the surface of a metal of Fe, Co and on the surface of Si, Mo. This point is the same as in the case of nucleation density of Si on the surface of $Si_3N_4$ and on the surface of $SiO_2$ shown in FIG. 3.

Thus, by forming a layer for formation of nonnucleation surface ($S_{NDS}$) with lower nucleation, density (ND) on the base substrate of any desired material other than diamond substrate, and forming nucleation surface ($S_{NDL}$) with higher nucleation density (ND) thereon to a sufficiently fine area, diamond single crystal can be formed with ease. Of course, as already mentioned, it is possible to form a diamond thin film of a polycrystalline structure with controlled grain size by arranging nucleation surfaces ($S_{NDL}$) having fine areas at desired intervals.

Also, according to the present invention, as the base substrate, it may be a substrate of the material capable of forming the above nonnucleation surface ($S_{NDS}$), and therefore the selection scope can be broadened to a great extent to accomplish low cost and enlargement of area with ease.

(2) Growth of tungsten single crystal

Tungsten has been known to effect no nucleation on the surface of $SiO_2$ layer, but to be deposited as a polycrystalline film on Si, $WSi_2$, PtSi, Al, etc.

First, on the substrate such as glass composed mainly of $SiO_2$, quartz, $SiO_2$ hot oxide film (all of these form nonnucleation surface ($S_{NDS}$)), Si, $WSi_2$, PtSi or Al is deposited by vacuum vapor deposition, and subjected to patterning to a size of several µm or less by photolithography to form a desired number of nucleation surfaces ($S_{NDL}$).

Subsequently, the above substrate is placed in, for example, a reaction furnace heated to 250°~500° C., and a gas mixture of $WF_6$ gas and hydrogen gas is permitted to flow under a reduced pressure of about 0.1 to 10 Torr, at the respective flow rates of 75 cc/min and 10 cc/min.

By doing so, tungsten is formed as represented by the reaction scheme $WF_6+3H_2 \rightarrow W+6HF$. In this case, the reactivity of tungsten with $SiO_2$ is extremely low to give no firm bonding, and therefore no nucleation occurs on the $SiO_2$ surface and hence no deposition is effected.

In contrast, on the above nucleation surface ($S_{NDL}$) formed of Si, $WSi_2$, PtSi, Al, etc., single crystal nuclei of tungsten are formed singly, because nucleation surfaces ($S_{NDL}$) are formed finely. And, the single crystal of tungsten continues to grow and also grows as such single crystal also in the lateral direction on $SiO_2$. This is because nonnucleus growth of tungsten occurs on $SiO_2$, whereby no polycrystal is formed by interference of single crystal growth.

The combination of the nonnucleation surface ($S_{NDS}$) forming material, nucleation surface ($S_{NDL}$) forming material and crystal forming material as described above is not limited to those shown in the above embodiments, but it may be clearly a combination of materials having sufficient nucleation density difference. Accordingly, also in the case of a compound semiconductor capable of selective nucleation such as GaAs, InP, etc., a single crystal, a group of single crystals or a polycrystal controlled in grain size and grain size distribution can be formed according to the present invention.

EXAMPLE 1

A 5 inch Si single crystal wafer was subjected to heat oxidation treatment to form a $SiO_2$ layer with a thickness of about 2000 Å on the surface [formation of nonnucleation surface ($S_{NDS}$)].

The substrate thus obtained was set in a reduced pressure chemical vapor deposition device and $Si_3N_4$ layer was formed to a thickness of 300 Å on the above $SiO_2$ layer according to the hot CVD method under the deposition conditions as follows.

| Pressure | 0.3 Torr |
|---|---|
| Gases used | $SiH_2Cl_2$ + $NH_3$ gas mixture |
| Flow rate ratio | $NH_3/SiH_2Cl_2$ = 6 |
| Temperature | 800° C. |

Next, the above $Si_3N_4$ layer was subjected to patterning according to the X-ray lithographic technique to form a $Si_3N_4$ fine region for nucleation surfaces ($S_{NDL}$) in a matrix arrangement of 50×100 with sizes of 1 μm and 150 μm pitch.

On the Si single crystal wafer having thus provided nonnucleation surface comprising $SiO_2$ ($S_{NDS}$) and nucleation surfaces ($S_{NDL}$) of 50×100 comprising $Si_3N_4$, Si single crystals were grown according to the hot CVD method under the Si single crystal growth conditions shown below.

| Pressure | 150 Torr |
|---|---|
| Gases used | $SiH_2Cl_2$ |
| Flow rate | 1.2 liter/min |
| Temperature | 1030° C. |
| Crystal growth time | 40 min |

The Si single crystal wafer applied with the crystal preparation treatment was taken out from the device, and the crystal was evaluated by observation with an electron microscope and X-ray diffraction. As the result, it was found that 50×100 Si single crystals with grain size of 80 μm and substantially no grain size distribution were formed with the above $Si_3N_4$ region as the center.

All of these Si single crystals were shown to have single crystal properties of extremely good quality.

EXAMPLE 2

Figure 9B:
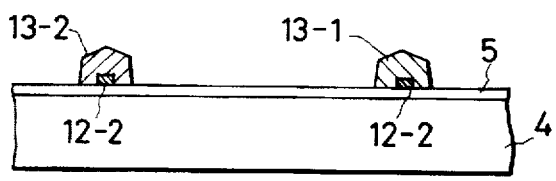
Figure 9C:
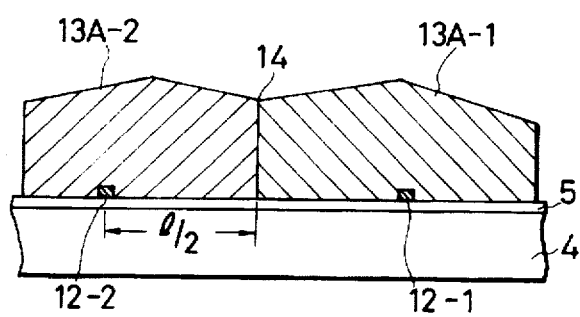

Under the same conditions as in EXAMPLE 1 except for taking sufficiently the time for growth of Si single crystals, a Si polycrystalline layer comprising the state in which adjacent Si single crystals mutually contact each other as shown in FIG. 9C was formed. On the surface of the polycrystalline layer, smoothening treatment was applied according to the selective etching method as conventionally practiced in the field of semiconductors.

By use of the Si polycrystalline layer having thus smoothened surface, P-MOS transistor was prepared according to the method conventionally used in the field of semiconductors and actuation characteristics were measured. As the result, it was found to be by far superior to the case of P-MOS transistor formed by use of the Si polycrystalline layer obtained according to the prior art method.

EXAMPLE 3

Figure 9D:
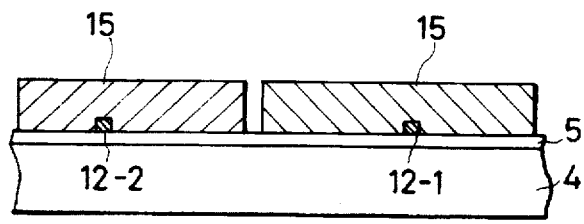

When Si single crystal group as shown in FIG. 9D was prepared under the growth conditions of substrate for formation of crystal and the crystal growth conditions shown below, and evaluated in the same manner as in EXAMPLE 1, the same results as in EXAMPLE 1 were obtained.

[Substrate growth conditions]

| Substrate | Si polycrystalline substrate having $SiO_2$ layer to a thickness of 2500 Å provided according to the hot CVD method |
|---|---|
| Pressure | 0.4 Torr |
| Gases used | $SiH_2Cl_2$ + $NH_3$ gas mixture |
| Flow rate ratio | $NH_3/SiH_2Cl_2$ = 7 |
| Silicon nitride fine region [nucleation surface ($S_{NDL}$)] | 0.5 μm size, 200 μm pitch, 100 × 100 matrix arrangement |

[Crystal growth conditions]

| Pressure | 120 Torr |
|---|---|
| Gases used | $SiHCl_3$ |
| Flow rate | 1.5 liter/min |
| Temperature | 1100° C. |
| Crystal growth time | 60 min |

[Si single crystal which is grown]
Grain size 170 μm Substantially no grain size distribution

EXAMPLE 4

Single crystals of diamond were prepared as described below.

A quartz base substrate was prepared, and a thin film of Co was prepared according to the vacuum vapor deposition method by resistance heating to a thickness of 1000 Å.

On the Co thin film thus formed, a Si thin film was provided according to the sputtering method to a thickness of 250 Å, and subsequently the Si thin film was subjected to patterning treatment according to the photolithographic method to form a nucleation surface ($S_{NDL}$) comprising Si thin film fine region in shape of 100×100 matrix with 1 μm size and 100 μm pitch on the Co thin film which is nonnucleation surface ($S_{NDS}$) (formation of diamond single crystal substrate).

By use of the thus obtained substrate for growth of single crystals, single crystals of diamond were grown according to the microwave plasma CVD method under the following conditions.

| Microwave output | 300 W |
|---|---|
| Substrate temperature | 950° C. |
| Pressure | 30 Torr |
| Starting material used | $CH_3OH$ ($H_2$ bubbling) |
| Flow rate | 0.5 liter/min |

Single crystals of diamond thus obtained had grain size of 60 μm substantially without grain size distribution, having extremely good electrical insulation and excellent thermal conductivity.

EXAMPLE 5

Single crystals of tungsten were grown as described below.

A Si single crystal wafer was prepared, and a $SiO_2$ layer with a thickness of 2000 Å was formed in the same manner as in EXAMPLE 1 [preparation of nonnucleation surface ($S_{NDS}$)].

On the $SiO_2$ layer, an Al thin film with a thickness of 200 Å was provided according to the vacuum vapor deposition method. This Al thin film was subjected to patterning by photolithography into a matrix of 50×50 with 5 μm size and 100 μm pitch [preparation of nucleation surface ($S_{NDL}$)]

On the thus obtained substrate for preparation of tungsten single crystals, single crystals of tungsten were prepared according to the hot CVD method under the following conditions. As a result, the grain size was 70 μm substantially without grain size distribution. All of the tungsten crystals formed on the substrate exhibited excellent single crystal properties.

| | |
|---|---|
| Pressure | 1 Torr |
| Gases used | $WF_6 + H_2$ gas mixture |
| $WF_6$ flow rate | 75 cc/min |
| $H_2$ flow rate | 10 cc/min |
| Crystal preparation time | 100 min |

As described in detail above, the crystal and the method for formation thereof according to the present invention, by forming sufficiently finely the nucleation surface ($S_{NDL}$) of a material with sufficiently greater nucleation density (ND) than the material for formation of nonnucleation surface ($S_{NDS}$) so that only a single nucleus may grow, permit single crystals to grow selectively at the sites where the fine nucleation surfaces ($S_{ND}$) exist, whereby crystals such as a single crystal with a necessary size, a plurality of island-shaped single crystals, a polycrystal controlled in grain size and grain size distribution, etc., can be formed easily on a base substrate of any desired material. Besides, no special new preparation device is required, but it can be formed by use of a device conventionally used in semiconductor process.

Also, the crystal according to the present invention is not limited to the materials of base substrates as in the prior art, and therefore three-dimensional integration, enlargement of area and reduction in cost can be easily accomplished. For example, since a single crystal or polycrystal of silicon which is the main material of semiconductor device can be easily formed on an amorphous insulating material, multi-layer of devices with excellent electrical properties can be accomplished to realize a multi-functional integrated circuit not found in the prior art. More specifically, it becomes possible to integrate or combine an optical device, a surface acoustic device, a piezoelectric device, etc., with the surrounding circuit IC of the respective devices, etc. Also, by use of a cheap glass or ceramic, etc., as the base material, application for a large area electronic device such as a large scale flat panel display in which driving circuits are integrated in a sheet of glass, etc., is rendered possible.

Further, the present invention, by forming the above nucleation surfaces ($S_{NDL}$) with desired sizes and desired distances on the nonnucleation surface ($S_{NDS}$), can form single crystals with necessary sizes on a plural number of sites, and therefore the formation steps can be simplified to a great extent and also the formation time can be shortened as compared with the melting solidification method in which single crystals are formed by irradiation of laser or electron beam.

Also, by controlling the intervals of the nucleation surfaces ($S_{NDL}$) formed on the above nonnucleation surface ($S_{NDS}$), a polycrystal controlled in grain size by the intervals can be formed. In this polycrystal formation method, controllability of grain size and grain size distribution is good and the formation time can be also shortened to a great extent as compared with the method of the prior art for forming a polycrystal with a large grain size according to the above melting solidification method.

We claim:

1. A method for forming a crystal article on a substrate, said crystal article having a crystal portion formed from a plurality of single crystals separated from each other and said substrate having a plurality of nucleation surfaces and a second surface comprising:

(a) vapor depositing on each of said plurality of nucleation surfaces a single nucleus for forming a single crystal, each of said nucleation surfaces (i) being amorphous, (ii) being formed of a deposited film of a material, different from the material constituting said second surface, (iii) having an area of 10 μm or less in maximum diameter and (iv) having a nucleation density sufficiently larger than the nucleation density of said second surface to selectively form said single nucleus; said nucleation surfaces being spaced apart from each other by a distance that is determined based on the desired size of said single crystals;

(b) growing by vapor deposition each said single crystal from each said single nucleus on said nucleation surface such that there is one single crystal grown on each said nucleation surface, each said single crystal being formed of a material different from the deposited film material of each said nucleation surface and each said single crystal being overgrown onto said second surface; and (c) polishing or etching the surface of each said single crystal to effect flattening.

2. A method for forming a crystal article on a substrate, said crystal article having a crystal portion formed from a plurality of single crystals separated from each other and said substrate having a plurality of nucleation surfaces and a second surface comprising:

(a) vapor depositing on each of said plurality of nucleation surfaces a single nucleus for forming a single crystal, each of said nucleation surfaces (i) being modified by ion-implantation from the composition of said second surface, (ii) having an area of 10 μm or less in maximum diameter and (iii) a nucleation density sufficiently larger than the nucleation density of said second surface to selectively form said single nucleus, said nucleation surfaces being spaced apart from each other by a distance that is determined based on the desired size of said single crystals;

(b) growing by vapor deposition each said single crystal from each said single nucleus on each said nucleation surface such that there is one single crystal grown for each said nucleation surface, each said single crystal being formed of a material different from the material constituting each said nucleation surface and each said single crystal being overgrown onto said second surface; and (c) polishing or etching the surface of each said single crystal to effect flattening.

3. The method according to any one of claim 1, wherein said nucleation surface is an area of 4 microns or less in maximum diameter.

4. The method according to any one of claim 1, wherein said single-crystal is constituted of a material selected from the group consisting of silicon, diamond and tungsten.

5. The method according to any one of claim 1, wherein said single-crystal is silicon single-crystal and said second surface is constituted of amorphous silicon oxide.

6. The method according to any one of claim 1, wherein said single-crystal is silicon single-crystal and said second surface is constituted of $SiO_2$.

7. The method according to any one of claim 1, wherein said single-crystal is silicon single-crystal and said nucleation surface is constituted of silicon nitride.

8. The method according to any one of claim 1, wherein said single-crystal is silicon single-crystal and said nucleation surface is constituted of $Si_3N_4$.

9. The method according to any one of claim 1, wherein said single-crystal is silicon single-crystal, said nucleation surface is constituted of silicon nitride, and said second surface is constituted of amorphous silicon oxide.

10. The method according to any one of claim 1, wherein said single-crystal is silicon single-crystal and said nucleation surface is constituted of tantalum oxide.

11. The method according to any one of claim 1, wherein said single-crystal is silicon single-crystal and said nucleation surface is constituted of silicon oxynitride.

12. The method according to any one of claim 2, wherein said nucleation surface is an area of 4 microns or less in maximum diameter.

13. The method according to any one of claim 2, wherein said single-crystal is constituted of a material selected from the group consisting of silicon and diamond.

14. The method according to any one of claim 2, wherein said single-crystal is silicon single-crystal and said second surface is constituted of $SiO_2$.

15. The method according to any one of claim 2, wherein said single-crystal is silicon single-crystal and said nucleation surface is formed by ion implantation of a material selected from the group consisting of Si, N, P, B, F, Ar, He, C, As, Ga and Ge into said non-nucleation surface constituted of $SiO_2$.

16. The method according to any one of claim 2, wherein said single-crystal is diamond single-crystal and said nucleation surface is formed by ion implantation of a material selected from the group consisting of Si, Ge, Cu, W, Ta, Mo, Au, Ti, Al and Ni into said second surface constituted of a material selected from the Group consisting of Fe or Co.

17. The method according to either one of claim 2, wherein said single-crystal is diamond single-crystal and said second surface is a constituent selected from the group consisting of iron and cobalt.

18. The method according to any one of claims 1 or 2 wherein said vapor depositing is conducted by chemical vapor depositing.

19. The method according to any one of claims 1, and 2, wherein said nucleation surface is a plural number of sections within said second surface.

20. The method according to any one of claims 1, and 2, wherein said nucleation surface is a plural number of regularly occurring sections within said second surface.

21. The method according to any one of claims 1, and 2, wherein said nucleation surface is a plural number of sections on said second surface.

22. The method according to any one of claims 1, and 2, wherein said nucleation surface is a plural number of regularly occurring sections on said second surface.

* * * * *

UNITED STATES PATENT AND TRADEMARK OFFICE
CERTIFICATE OF CORRECTION

PATENT NO. : 5,733,369
DATED : March 31, 1998
INVENTOR(S) : TAKAO YONEHARA ET AL.

It is certified that error appears in the above-identified patent and that said Letters Patent is hereby corrected as shown below:

COLUMN 1

Line 39, "LED" should read --LEDs--;
Line 44, "what" should read --What--; and
Line 50, "coefficient" should read --coefficients--.

COLUMN 2

Line 8, "developments" should read --development--;
Line 13, "developments" should read --development--;
Line 20, "as" should read --as a--;
Line 52, "from its characteristics" should be deleted; and
Line 55, "Å, and a mobility to the same extent" should read
--Å is obtained, and a mobility of the same magnitude is obtained--;

COLUMN 3

Line 7, "due" should read --due to--; and
Line 17, "surpass" should read --surpasses--.

COLUMN 4

Line 34, "$(S_{NDS})$" should read --$(S_{NDL})$--; (second occurrence); and
Line 38, "$(S_{NDS})$" should read --$(S_{NDL})$--.

UNITED STATES PATENT AND TRADEMARK OFFICE
CERTIFICATE OF CORRECTION

PATENT NO. : 5,733,369

DATED : March 31, 1998

INVENTOR(S) : TAKAO YONEHARA ET AL.

It is certified that error appears in the above-identified patent and that said Letters Patent is hereby corrected as shown below:

COLUMN 6

Line 4, "nucleus"," should read --nuclei",-- and
         " "initial nucleus". "
         should read --"initial nuclei".--.

COLUMN 7

Line 5, "$cm^{312}$" should read --$cm^{-2}$--.

COLUMN 9

Line 38, "as the fact" should be deleted;
    Line 49, "at" should read --in--;
    Line 50, "illustration" should read --illustrations--; and
    Line 56, "surfaces" should read --surface--.

COLUMN 10

Line 1, "only" should read --only a--; and
    Line 6, "embedding" should read --they fill--.

COLUMN 11

Line 6, "grains" should read --grain--;
    Line 8, "Since" should read --¶ Since;
    Line 37, "11t" should read --11--;
    Line 48, "as" should read --a--;
    Line 56, "less, in maximum diameter" should read
         --less in maximum diameter,--; and
    Line 57, "micron" should read --microns--.

UNITED STATES PATENT AND TRADEMARK OFFICE
CERTIFICATE OF CORRECTION

PATENT NO. : 5,733,369
DATED : March 31, 1998
INVENTOR(S) : TAKAO YONEHARA ET AL.

It is certified that error appears in the above-identified patent and that said Letters Patent is hereby corrected as shown below:

COLUMN 13

Line 44, "silicon." should read --silicon--; and
Line 53, "nucleus" should read --nuclei--.

COLUMN 14

Line 20, "$Si^{30}$" should read --$Si^+$--;
Line 40, "$SiC_2$ at all IT." should read --$SiO_2$ at all (T.--;
Line 45, "$SiC_2$" should read --$SiO_2$--;
Line 52, "SiC" should read --SiO--; and
Line 53, "$SIC_2$" should read --$SiO_2$--.

COLUMN 15

Line 2, "device," should read --devices,--; and
Line 26, "micrometer" should read --micrometers--;

COLUMN 16

Line 15, "0f" should read --Of--.

COLUMN 18

Line 8, "$NH_3/SiH_2Cl_2=7$" should read
--$NH_3/SiH_2Cl_2=7$
¶ Temperature    950°C--; and
Line 23, "Substantially no grain size distribution" should read --¶ Substantially no grain size distribution--.

UNITED STATES PATENT AND TRADEMARK OFFICE
CERTIFICATE OF CORRECTION

PATENT NO. : 5,733,369

DATED : March 31, 1998

INVENTOR(S) : TAKAO YONEHARA ET AL.

It is certified that error appears in the above-identified patent and that said Letters Patent is hereby corrected as shown below:

COLUMN 19

Line 37, "device" should read --devices--.

COLUMN 20

Line 56, "any one of" should be deleted;
    Line 59, "any one of" should be deleted;
    Line 62, "any one of" should be deleted; and
    Line 65, "any one of" should be deleted.

COLUMN 21

Line 1, "any one of" should be deleted;
    Line 4, "any one of" should be deleted;
    Line 6, "any one of" should be deleted;
    Line 10, "any one of" should be deleted;
    Line 13, "any one of" should be deleted;
    Line 16, "any one of" should be deleted;
    Line 18, "any one of" should be deleted;
    Line 21, "any one of" should be deleted; and
    Line 24, "any one of" should be deleted."

UNITED STATES PATENT AND TRADEMARK OFFICE
CERTIFICATE OF CORRECTION

PATENT NO. : 5,733,369

DATED : March 31, 1998

INVENTOR(S) : TAKAO YONEHARA ET AL.

It is certified that error appears in the above-identified patent and that said Letters Patent is hereby corrected as shown below:

<u>COLUMN 22</u>

Line 1, "any one of" should be deleted;
    Line 7, "either one of" should be deleted;
    Line 15, "1," should read --1--;
    Line 18, "1," should read --1--;
    Line 21, "1," should read --1--; and
    Line 24, "1," should read --1--.

Signed and Sealed this

Tenth Day of November 1998

Attest:

BRUCE LEHMAN

Attesting Officer     Commissioner of Patents and Trademarks